United States Patent [19]

Malka et al.

[11] Patent Number: 4,631,484

[45] Date of Patent: Dec. 23, 1986

[54] MULTIMODE PULSE GENERATOR

[75] Inventors: Jacob H. Malka, Fair Lawn; Mordechai Friedlander, Palisades Park, both of N.J.

[73] Assignee: Allied Corporation, Morris Twp., Morris County, N.J.

[21] Appl. No.: 684,757

[22] Filed: Dec. 21, 1984

[51] Int. Cl.$^4$ .......................... H03K 3/86; H03K 5/26
[52] U.S. Cl. ........................................ 328/63; 328/55; 377/44; 377/26; 307/269
[58] Field of Search .................... 328/63, 55; 307/269; 377/55, 44, 26

[56] References Cited

U.S. PATENT DOCUMENTS 4,408,333 10/1983 Fujii .................................... 307/269
4,524,448 6/1985 Hullwegen ........................... 328/63
4,564,953 1/1986 Werking ................................ 377/44

Primary Examiner—John S. Heyman
Attorney, Agent, or Firm—Howard G. Massung; Anthony F. Cuoco; Stanley N. Protigal

[57] ABSTRACT

A pulse generator (2) provides output pulses which are phase-synchronized to pulses from an external trigger source (3) through the use of gated delay lines (13) used as clocks. Output mode versatility is achieved by storing desired pulse output waveforms in a random access memory device (26). Expanded output resolution is achieved via an arrangement of three independent counters (10, 20, 24). A fourth independent counter (40) is used for burst counting. A pair of converters (36, 38) are used to provide an output amplitude monitor/test capability.

16 Claims, 9 Drawing Figures

4,631,484

MULTIMODE PULSE GENERATOR

BACKGROUND OF THE INVENTION

Pulse generators with combined capabilities such as clock-to-trigger phase synchronization; output mode versatility; expanded resolution for a fraction of a cycle; and continuous output monitoring and calibration have not heretofore been readily available. The present invention achieves the aforenoted capabilities through a novel combination of standard components. Hence, clock-to-trigger phase synchronization is achieved using gated delay lines instead of the traditional free-running crystal oscillators. Output mode versatility is achieved by storing desired pulses, pulse trains, digital words or waveforms and expanded resolution is achieved through the use of a counter arrangement. Continuous output monitoring and testing are achieved via an arrangement featuring counters and converters.

Accordingly, it is the object of this invention to provide a pulse generator which features a novel arrangement of standard components to achieve a high degree of versatility and multimode operation.

SUMMARY OF THE INVENTION

This invention contemplates a multimode pulse generator for providing a variety of output pulse waveforms at voltage levels phase-synchronized to external trigger pulses. Multimode operation and high resolution are achieved via delay lines, counters and random access memory (RAM) means. Synchronization to external pulses is achieved via gated delay lines which are used as clocks. Output mode versatility is achieved by storing the desired outputs in a RAM. The incremental amplitudes of a waveform are predetermined and loaded into the pulse generator as logic level signals on a pulse by pulse basis. Expanded resolution is achieved through the use of three independent counters and features a logical division of each counting cycle into three or less periods. The expanded resolution portion of the output has a predetermined number of increments, each of which is individually keyed to an output in a predetermined voltage range. A fourth independent counter is used for burst counting. Root Mean Square to D.C. (RMS/D.C.) and analog to digital converters provide an output amplitude monitor/test capability.

DETAILED DESCRIPTION OF THE INVENTION

Figure 1:
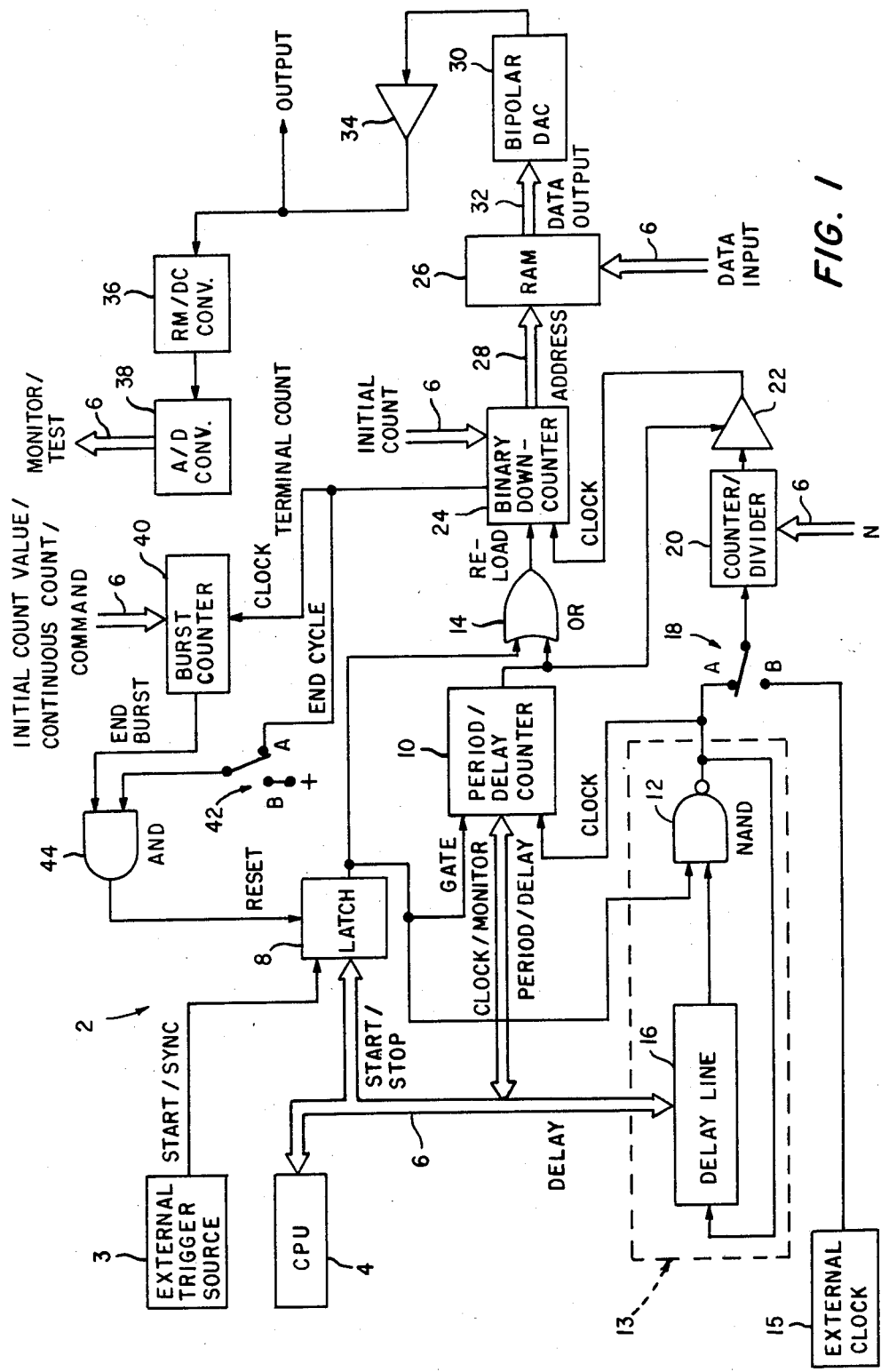
FIG. 1 is a block diagram showing the structural implementation of the invention.

With reference to FIG. 1, the multimode pulse generator of the invention is designated generally by the numeral 2 and in the preferred embodiment of the invention is controlled by a central processing unit (CPU) 4 through an input/output bus 6. It will be understood, however, that the invention may be controlled by means such as a toggle switch or any other such means that will provide logic level inputs as required.

Pulse generator 2 includes a latch 8 which is connected to CPU 4 through bus 6 for receiving start/stop inputs therefrom, and is connected to an external trigger source 3 for receiving starting/synchronizing inputs therefrom. Latch 8 is connected to a period/delay counter 10 for applying a gate input thereto and is connected to a NAND gate 12 and an OR gate 14.

Counter 10 is connected to CPU 4 via bus 6 for receiving period/delay inputs therefrom and for applying clock/monitor outputs thereto. A delay line 16 is connected to CPU 4 through bus 6 for receiving delay inputs therefrom. The output of delay line 16 is applied to NAND gate 12. The output of NAND gate 12 is fed back to delay line 16 and is applied as a clock input to counter 10. The arrangement is such that delay line 16 and NAND gate 12 form an internal clock 13.

The output of NAND gate 12 is applied to a terminal A of a switch 18. A signal from an external clock 15 is applied to terminal B of switch 18. The arm of switch 18 normally contacts terminal A and is connected to a counter/divider 20 which is connected to CPU 4 via bus 6 for receiving a predetermined dividing input N therefrom.

The output of counter/divider 20 is connected to a gate 22 which is controlled by the output of counter 10. The output of gate 22, which is a clock output, and the output of OR gate 14, which is a reload output, are applied to a binary down-counter 24 which is connected to CPU 4 through bus 6 for receiving an initial count therefrom.

A random access memory (RAM) 26 is connected to binary downcounter 24 through an address bus 28 and is connected to CPU 4 through bus 6 for receiving input data therefrom. A bipolar digital to analog converter (DAC) 30 is connected to RAM 26 through a output data bus 32. The output from DAC 30 is applied to an amplifier 34 which provides the output of pulse generator 2.

The pulse output from amplifier 34 is applied to a root mean square to D.C. (RMS/D.C.) converter 36. The output from converter 36 is applied to an analog to digital (A/D) converter 38. Analog to digital converter 38 provides a monitor/test output which is applied to CPU 4 through bus 6.

A burst counter 40 is connected to CPU 4 through bus 6 for receiving an initial count value or a continuous count command input therefrom and is connected to a terminal count output of binary counter 24 for receiving a clock input therefrom. An end burst output from burst counter 40 is applied to an AND gate 44, intermediate burst counter 40 and latch 8.

The output from binary counter 24 is applied through a switch 42, having its arm normally contacting a terminal A, to AND gate 44, whereby an end cycle output is applied to gate 44. When the switch arm is actuated to contact a terminal B which is connected to a positive (+) voltage source (not otherwise shown), the end cycle output from binary counter 24 is not applied to gate 44. Gate 44 applies a reset output to latch 8.

With the aforegoing description of the implementation of the invention in mind, the operation of the invention will be described with reference first to FIG. 2 and then with reference to FIGS. 3-9.

Figure 2:
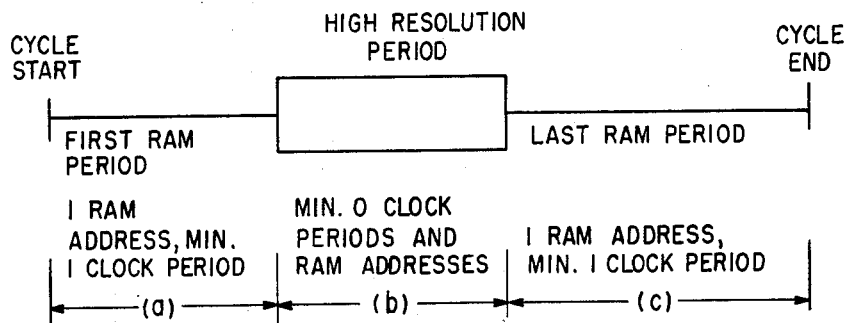
FIG. 2 is a graphical representation generally showing the output cycle characteristics of the invention.

With reference to FIG. 2, the output cycle of the pulse generator herein described is generally divided into three independent periods designated in FIG. 2 as (a), (b), and (c). Period (a) is designated as the first RAM period, period (b) is designated as the high resolution period and period (c) is designated as a last RAM period. The output cycle starts at the beginning of the first RAM period (minimum one clock period, one RAM address), proceeds to the high resolution period (minimum zero clock periods and RAM addresses) and terminates at the end of the last RAM period (minimum one clock period, one RAM address). Duration of these periods relative to each other and to the overall cycle, and the means by which the periods are triggered are distinctive to the operating modes of the invention to be hereinafter described.

Generally, latch 8 is latched by either CPU 4 or by external trigger source 3. The latching of latch 8 is effective to gate period/delay counter 10 and set binary counter 24 through OR gate 14 to an initial value which starts the first RAM period (a) of the output cycle. Binary counter 24 stays at this initial value until a first clock pulse from clock 13 is passed by gate 22 to counter 24. Clock 13 starts in phase with latch 8 once gate 12 in the clock is enabled by the latch. When a second clock pulse from clock 13 passes through gate 22, binary counter 24 starts counting down from the end of the first RAM period (a) to the beginning of the last RAM period (c). This is designated as the high resolution period (b) of the output cycle. Binary counter 24, and hence RAM 26, stay at the last RAM value as shown in FIG. 2 until the end of the cycle in counter 10 and subsequent recycling.

Figure 3:
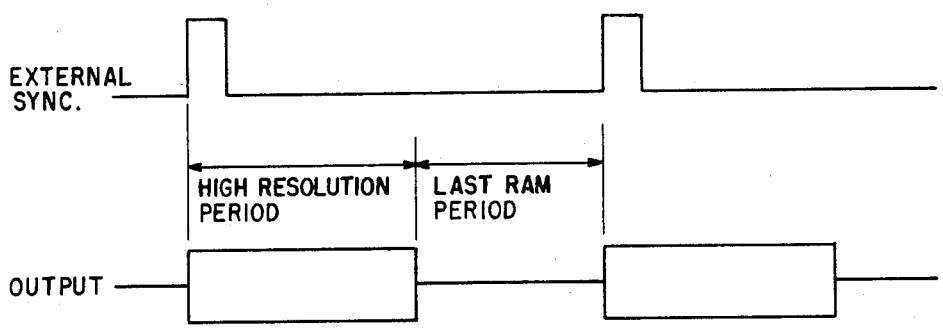
FIGS. 3 through 9 are graphical representations showing the output cycle characteristics of the invention for particular modes of operation.

With reference to FIG. 3, a mode of operation of the invention is illustrated which features external synchronization and an immediate high resolution period. The high resolution period of the output cycle occurs immediately after latch 8 is latched by a synchronizing signal from external trigger source 3. After completion of the high resolution period, the output stays at the last RAM period value (which can be zero or any voltage level) until the next synchronizing signal is received.

In this mode, period/delay counter 10 is disabled, gate 22 is continuously enabled and the arm of switch 42 contacts terminal A for external synchronization. The external synchronizing signal latches latch 8. With latch 8 thus latched or turned on, the loading of the first memory address into binary counter 24 occurs via gate 14, and gate 12 in counter 13 is enabled. The first clock pulse is thus generated by counter 13 synchronously with the external synchronizing signal. The first memory address introduces the first memory data stored in RAM 26 into bipolar DAC 30 which drives output amplifier 34.

At the same time, clock 13 continues to run and its output frequency is divided through counter/divider 20 by N until binary counter 24 counts down to zero (the last memory address) and provides a signal signifying the end of the cycle. Since switch 42 is in the external synchronizing position, latch 8 is reset, clock 13 is inhibited and the output stays at the last RAM value until another external synchronizing signal is received. The end cycle signal also decrements burst counter 40 which, if not in the continuous count command mode, disables latch 8 on a terminal burst count and prevents the latch from receiving additional external signals.

Figure 4:
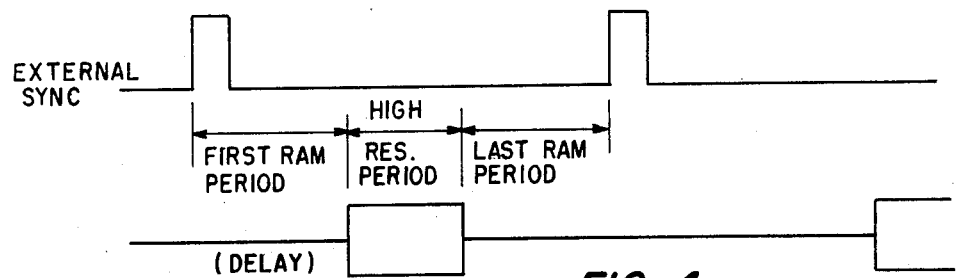

FIG. 4 illustrates a mode of operation featuring an external synchronizing signal and a delayed high resolution period. Thus, the high resolution period of the cycle occurs after a "wait" or delay period on the first RAM period value which follows the external synchronizing signal. After completion of the high resolution period, the output stays at the last RAM period value, which can be zero or some other voltage, until the next synchronizing signal is received.

In this mode of operation, the external synchronizing signal turns latch 8 on. This loads the first memory address into binary down counter 24 via gate 14 and starts clock 13. The first memory address introduces the first memory data from RAM 26 into bipolar digital to analog converter 30 which drives output amplifier 34. In the meantime, clock 13 decrements period/delay counter 10, but is prohibited from affecting the output of binary counter 24 since gate 22 is disabled. Upon completion of the delay period counting (first RAM value period), gate 22 is enabled and counter 24 is decremented. The remaining portion of the cycle is identical to that heretofore described with reference to FIG. 3.

Figure 5:
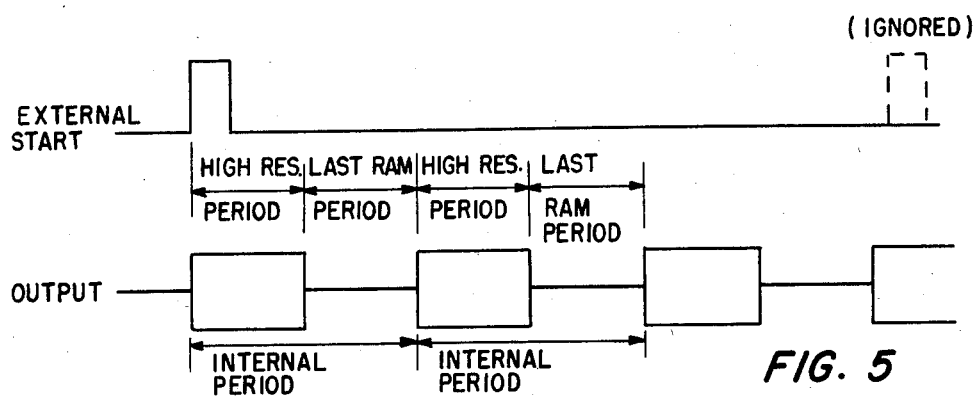

FIG. 5 illustrates a mode of operation featuring an external start with an immediate high resolution output. In this mode, external trigger source 3 starts the complete burst (or continuous) output with an internal period being determined by counter 10. Any following external pulse is either ignored or used in a toggle mode. That is to say, the first pulse starts the burst and the next pulse stops the burst, and so on. Switch 42 is in position B, or the external start position. The period count is loaded into counter 10 and gate 22 is enabled. The external starting pulse turns latch 8 on, whereby the first memory address is loaded into binary counter 24 and clock 13 starts. The first memory address introduces the first memory data into bipolar digital to analog converter 30 which drives output amplifier 34. Meanwhile, clock 13 continues to run.

When binary counter 24 reaches zero (the last memory address) it outputs an end cycle signal. Since the arm of switch 42 contacts terminal B (external start), latch 8 remains on and the output remains at the last RAM period value. Clock 13 continues to run and counter 10 is decremented until the end of the period. At that time, a single pulse is generated by counter 10 which reloads the first RAM address into counter 24 through gate 14. Since clock 13 is running continuously, this cycle is repeated until an end burst signal from burst counter 40 resets latch 8 or the latch is otherwise stopped by an external command.

Figure 6:
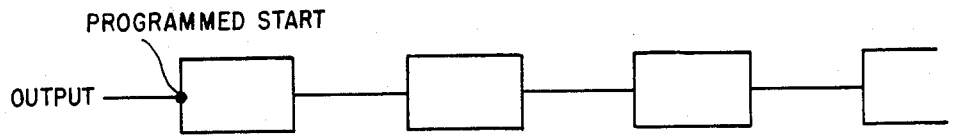

With reference to FIG. 6, a mode of operation is illustrated which features an internal start and an immediate high resolution output. This mode of operation is similar to that described with reference to FIG. 5 except that programmed start and stop commands are fed into latch 8 and are used to control the output.

Figure 7:
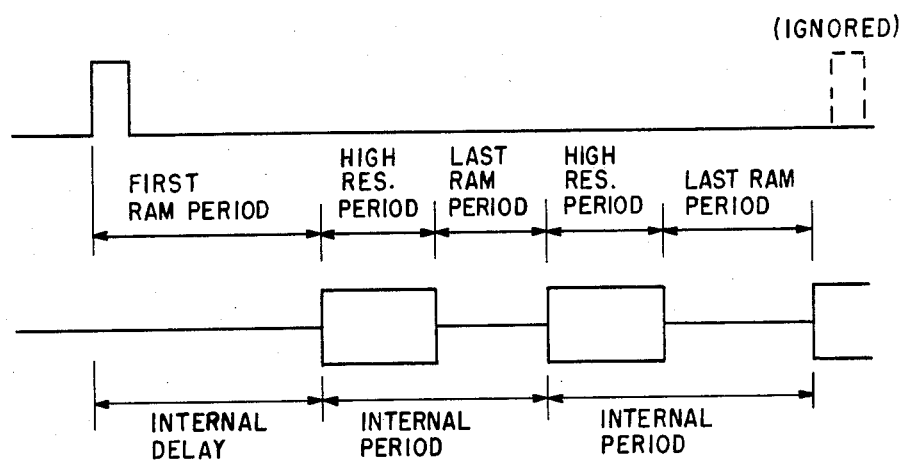

A mode of operation featuring an external start and an initial delay is illustrated in FIG. 7. This mode of operation is similar to that described with reference to FIG. 5 except that counter 10 is initially loaded with a period/delay count. After sensing an external start signal via latch 8, clock 13 starts running but gate 22 is disabled. Hence, the output stays on the first RAM value, which in most cases is zero volts, until the end of the delay period. During this time counter 10 is re-loaded. This time the counter is re-loaded with the period count (if the period count differs from the delay count). When the delay count is completed, gate 22 is enabled and the rest of the cycle continues in a manner similar to that described with reference to FIG. 5.

Figure 8:
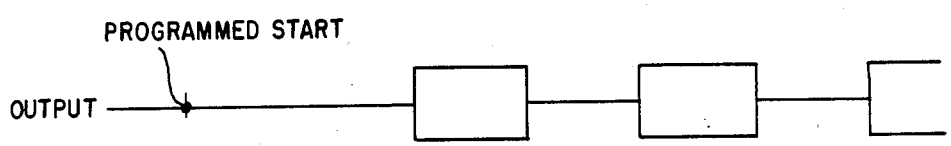

With reference to FIG. 8, a mode of operation is described which features an internal start and an initial delay. This mode is similar to the mode of operation described with reference to FIG. 6 except that programmed start and stop commands are used to control the output.

Figure 9:
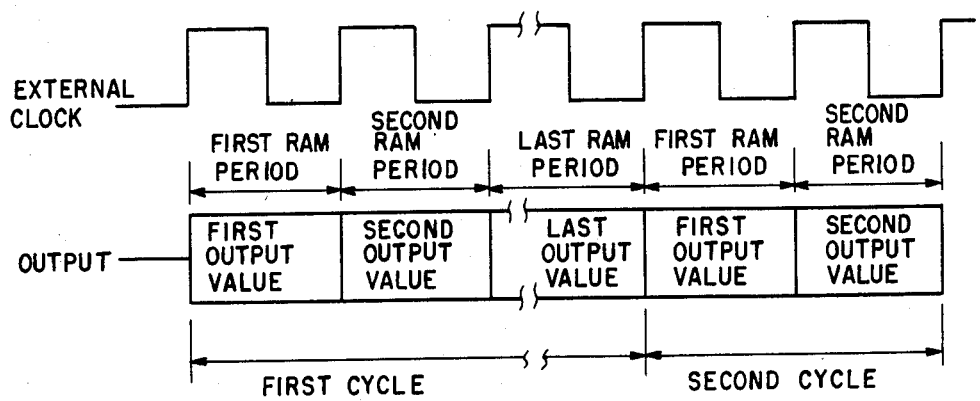

With reference to FIG. 9, a mode of operation is described featuring an external clock 15. In this mode of operation, the arm of switch 18 contacts terminal B. Pulses from external clock 15 are used as a clock (divided by N if desired) to drive counter 24 directly, with each pulse decrementing the counter by one. When the end of the cycle is reached, the generated end cycle signal from binary down counter 24 is wrapped around to the re-load input of the counter through a wrap around path (not shown) such as is well known in the art. This cycle is repeated until the external clock stops or the burst count is completed. The entire output cycle is stored in the high resolution period. This mode of operation is used primarily for the output of serial digital words.

With reference to the aforegoing description of the invention, it is to be emphasized that in all modes of operation, burst counter 40 can be enabled or disabled (continuous operation). In the modes of operation described with reference to FIGS. 1 through 8, an internal clock (clock 13) is used and the arm of switch 18 is in the internal clock position (A) as shown in FIG. 1.

It will now be understood that a pulse generator has been described which provides pulse outputs at predetermined voltage levels which may be phase-synchronized to external pulses. Multimode operation and high resolution are achieved through the use of delay devices, counters and memory components. Synchronization to external pulses is achieved via gated delay lines which are used as clocks. Output mode versatility is achieved by storing the desired outputs in random access memory 26.

In operation, the incremental amplitudes of a waveform are predetermined and loaded by CPU 4 on a pulse-by-pulse basis. Expanded resolution is achieved through the use of three independent counters 10, 20 and 24 and the logical division of each counting cycle into independent periods (a), (b) and (c). The high resolution portion of the output is a predetermined number of increments, each of which outputs in a predetermined voltage range. Another independent counter 40 is used for burst counting. RMS to D.C. and analog to digital converters enhance the pulse generator by providing a monitor/test capability.

It will be understood that the components of the invention herein described and shown in the drawing are commercially marketed components such as are readily available as circuit chips. The novelty of the invention therefore resides in the combination of these components and not in the elements themselves.

With the aforegoing description of the invention in mind, reference is had to the appended claims for a definition of the scope of the invention.

What is claimed is:

1. A pulse generator for providing output pulse waveform cycles having an expanded resolution period and phase synchronization to external trigger pulses from an external trigger source, characterized by:
   memory means for storing predetermined pulse output waveforms;
   latch means receiving the external trigger pulses and latched thereby for providing outputs;
   means for providing delay data;
   clock means including an internal clock having delay line means connected to the delay data means and responsive to the data therefrom for providing delay outputs, and first gating means connected to the delay line means and to the latch means for gating the latch outputs and the delay outputs and for providing clock outputs in phase synchronization with the latch outputs; and
   first counter means connected to the latch means, the clock means and the memory means, and responsive to the outputs from the latch means and the clock means for addressing the memory means, whereby the memory means provides predetermined stored output pulse waveform cycles, each cycle having a maximum of three periods, one of which is the expanded resolution period.

2. A pulse generator as described by claim 1, further characterized by:
   the clock outputs in phase synchronization with the latch outputs being fed back to the delay line means.

3. A pulse generator as described by claim 1, further characterized by:
   second counter means;
   first switching means operative for connecting the second counter means to the first gating means, said second counter means counting the clock outputs from the first gating means and providing a predetermined count of the clock outputs; and
   second gating means connected to the second counter means and to the first counter means for gating the predetermined count of the clock outputs to the first counter means.

4. A pulse generator as described by claim 3, further characterized by:
   means for providing a dividing output; and
   the second counter means connected to the dividing output means and responsive to the dividing output therefrom for providing a predetermined divided count of the clock outputs.

5. A pulse generator as described by claim 3, wherein the first counter means is characterized by:
   a first counter connected to the latch means and to the first gating means, and gated by the latch outputs from the latch means and clocked by the clock outputs from the first gating means for providing counting outputs;
   third gating means connected to the latch means and the first counter and responsive to the latch outputs or the counting outputs for providing a loading output; and
   a second counter connected to the third gating means and to the memory means and responsive to the loading output from the third gating means for counting from one output pulse waveform cycle to another and for addressing the memory means, whereupon the memory means provides the predetermined stored output pulse waveform cycles.

6. A pulse generator as described by claim 5, further characterized by:
   the second gating means being connected to the first counter and controlled by the counting outputs therefrom.

7. A pulse generator as described by claim 5, further characterized by:
   the second counter providing a clock output and an output signifying the end of an output pulse waveform cycle;
   a third counter connected to the second counter and responsive to the clock output therefrom for providing a termination output;

fourth gating means connected to the third counter;
second switching means operable for connecting the second counter to the fourth gating means;
the fourth gating means being responsive to the termination output from the third counter and to the end cycle output from the second counter applied through the second switching means for providing a reset output; and
the latch means connected to the fourth gating means and responsive to the reset output for being reset thereby.

8. A pulse generator as described by claim 1, further characterized by:
converting means connected to the memory means for converting the output pulse waveform cycles provided thereby to monitor/test outputs.

9. A pulse generator as described by claim 3, further characterized by:
an external clock for providing clock outputs;
the first switching means operative for connecting the external clock to the second counter means and for disconnecting the internal clock therefrom; and
said second counter means counting the clock outputs from the external clock and providing a predetermined count of the clock outputs.

10. A pulse generator as described by claim 7, characterized by:
the second switching means operable for disconnecting the second counter from the fourth gating means, whereupon the end cycle output from said counter is prevented from being applied to the fourth gating means and said fourth gating means is prevented from providing the reset output.

11. A pulse generator as described by claim 1, characterized by:
the latch means receiving an external trigger pulse and latched thereby for providing an output; and
the first counter means being responsive to the output from the latch means and the clock outputs from the clock means for addressing the memory means to start an output pulse waveform cycle which has an immediate expanded resolution period and a memory output period following the expanded resolution period and lasting until the latch means receives another external trigger pulse to start another cycle.

12. A pulse generator as described by claim 1, characterized by:
the latch means receiving an external trigger pulse and latched thereby for providing an output; and
the first counter means being responsive to the output from the latch means and the clock outputs from the clock means for addressing the memory means to start an output pulse waveform cycle which has a first memory output period, and expanded resolution output period which is delayed from starting until the end of the first memory output period, and a last memory output period which starts at the end of the expanded resolution period and lasts until the latch means receives another external trigger pulse to start another cycle.

13. A pulse generator as described by claim 1, characterized by:
the latch means receiving a first external trigger pulse for providing a first output and a second external trigger pulse for providing a second output;
the first counter means being responsive to the first and second latch outputs for defining an internal period; and
the first counter means being responsive to the latch outputs from the latch means and the clock outputs from the clock means for addressing the memory means to start an output pulse waveform cycle having a plurality of internal periods, with each of the internal periods having an immediate expanded resolution period and a memory output period following the expanded resolution period.

14. A pulse generator as described by claim 1, characterized by:
an external clock for providing clock outputs;
the latch means receiving an external pulse and latched thereby for providing an output; and
the first counter means being responsive to the outputs from the external clock and the output from the latch means for addressing the memory means to provide output pulse waveform cycles having memory output periods occurring during the expanded resolution period.

15. A pulse generator for providing output pulse cycles having an expanded resolution output period and providing predetermined output pulse waveforms phase synchronized to external trigger pulses, characterized by:
memory means for storing the predetermined output pulse waveforms;
means for providing the external trigger pulses;
latch means connected to the external trigger pulse means and being latched by a pulse received therefrom for providing an output;
first counter means connected to the latch means and responsive to the output therefrom for providing an output;
second counter means connected to the memory means for addressing said memory means;
clock means connected to the latch means and responsive to the output therefrom for providing outputs in phase synchronization with the latch output;
first gating means for connecting the latch means and the first counter means to the second counter means;
second gating means for connecting the second counter means to the clock means;
the second counter means being responsive to one of the outputs from the latch means and the first counter means applied through the first gating means for addressing the memory means to start a first memory output period in a pulse output cycle, said first memory output period lasting until a first output from the clock means is applied to the second counting means through the second gating means;
the second counter means starting to count down from the end of the first memory output period to the beginning of a last memory output period when a second output from the clock means is applied to the second counter means through the second gating means, whereupon the memory means is addressed by the second counter means to start the last memory output period;
the period between the end of the first memory output period and the beginning of the last memory output period being an expanded resolution output period; and the output pulse cycle remaining at the last memory output period until the latch means receives another pulse from the external trigger pulse means to start another output pulse cycle.

16. A pulse generator for providing output pulse waveform cycles having an expanded resolution period and phase synchronization to external trigger pulses from an external trigger source, characterized by:

memory means for storing predetermined pulse output waveforms;

latch means receiving the external trigger pulses and latched thereby for providing outputs;

clock means connected to the latch means and responsive to the outputs therefrom for providing clock outputs in phase synchronization with the latch outputs;

counter means connected to the latch means, the clock means and the memory means, and responsive to the outputs from the latch means and the clock means for addressing the memory means, whereby the memory means provides predetermined stored output pulse waveform cycles, each cycle having a maximum of three periods, one of which is the expanded resolution period;

the latch means receiving a first external trigger pulse for providing a first output and a second external trigger pulse for providing a second output;

means for providing a period delay output;

the counter means being responsive to the first and second latch means outputs for defining an internal period; and the counter means being responsive to the first and second latch outputs from the latch means, the period delay output and the clock outputs from the clock means for addressing the memory means to start an output pulse waveform cycle having a plurality of internal periods including a first memory output period occurring during a delay period defined by the period delay output, an expanded resolution period which starts at the end of the delay period, and a memory output period which starts at the end of the expanded resolution period.

* * * * *